United States Patent
Driemel et al.

(10) Patent No.: US 8,604,790 B2
(45) Date of Patent: Dec. 10, 2013

(54) MAGNETIC RESONANCE SURFACE COIL

(75) Inventors: Daniel Driemel, Oederan (DE); Steffen Wolf, Roettenbach (DE)

(73) Assignee: Siemens Aktiengesellschaft, Munich (DE)

( * ) Notice: Subject to any disclaimer, the term of this patent is extended or adjusted under 35 U.S.C. 154(b) by 559 days.

(21) Appl. No.: 12/844,936

(22) Filed: Jul. 28, 2010

(65) Prior Publication Data

US 2011/0037470 A1 Feb. 17, 2011

(30) Foreign Application Priority Data

Aug. 11, 2009 (DE) .......................... 10 2009 036 938

(51) Int. Cl.
*G01V 3/00* (2006.01)
(52) U.S. Cl.
USPC .......................................... 324/318
(58) Field of Classification Search
USPC ................................. 324/300–322
See application file for complete search history.

(56) References Cited

U.S. PATENT DOCUMENTS

| | | | | |
|---|---|---|---|---|
| 6,498,489 | B1 * | 12/2002 | Vij ................................. | 324/322 |
| 6,867,593 | B2 * | 3/2005 | Menon et al. ................. | 324/318 |
| 6,943,551 | B2 | 9/2005 | Eberler et al. | |
| 7,844,318 | B2 * | 11/2010 | Rezzonico et al. ........... | 600/410 |
| 8,008,917 | B2 * | 8/2011 | Satragno et al. .............. | 324/318 |
| 8,046,046 | B2 * | 10/2011 | Chan et al. .................... | 600/422 |
| 8,290,569 | B2 * | 10/2012 | Piron et al. .................... | 600/415 |
| 8,294,460 | B2 * | 10/2012 | Driemel ......................... | 324/307 |

FOREIGN PATENT DOCUMENTS

WO  WO 2007/039842 A2  4/2007

\* cited by examiner

*Primary Examiner* — Dixomara Vargas
(74) *Attorney, Agent, or Firm* — Schiff Hardin LLP (57) ABSTRACT

A plug block module for a surface coil for a magnetic resonance tomography apparatus has a plug block body with contacts for connection lines that can be connected with a magnetic resonance tomography apparatus, an adapter plug that can be inserted into an adapter plug of the surface coil, a surface coil connector device that fixes the plug block module to the surface coil, and a connection between the plug block and the adapter plug.

16 Claims, 7 Drawing Sheets

MAGNETIC RESONANCE SURFACE COIL

BACKGROUND OF THE INVENTION

1. Field of the Invention

The present invention concerns a surface coil for a magnetic resonance tomography apparatus and a plug module for a surface coil.

2. Description of the Prior Art

Magnetic resonance apparatuses, in particular for the examination of patients, are generally known, for example from Patent Document DE10314215B4.

Modern magnetic resonance systems (also called MR or MRT systems) normally operate with multiple different antennas (also called coils in the following) to emit radio-frequency pulses for nuclear magnetic resonance excitation and/or to receive induced magnetic resonance signals. A magnetic resonance system frequently has a larger coil permanently installed in the apparatus (known as a whole-body coil, also called a body coil) and multiple small local coils (also called surface coils). In contrast to the whole-body coil, the local coils serve to acquire detailed images of body parts or organs of a patient that are located relatively close to the surface of the body. For this purpose the local coils are applied at the point of the patient at which the region to be examined is located.

Surface coils for magnetic resonance tomography are connected with the MRT system for transmission of signals to be transmitted and/or received. For example, it is known to make this connection with electrical plug connections. Multiple individual contacts (coaxial and signal contacts) can be combined into one plug block. In coils with a direct connection, the plug blocks are attached to the coil housing. Conductors connected or soldered to the individual contacts connect the plug blocks directly with electronic components inside the coil. Damage to the individual contacts that can lead to failure of the coil can arise due to wear or inappropriate handling of the coil by the user.

SUMMARY OF THE INVENTION

An object of the present invention to optimize a surface coil.

The invention is a plug block module for a surface coil for a magnetic resonance tomography apparatus, the plug module having a plug block body with contacts for connection lines that can be connected with a magnetic resonance tomography apparatus, an adapter plug that can be inserted into an adapter plug of the surface coil, a surface coil connector device to fix the plug block module to the surface coil, with a connection between the plug block and the adapter plug.

The invention also encompasses a magnetic resonance tomography surface coil with at least one adapter plug into which an adapter plug of a plug module as described above can be inserted, and with a surface coil connection device to fix the plug block module on the surface coil.

The connection between the plug block and the adapter plug is an electrical connection of the plug block and the adapter plug.

According to one embodiment of the invention, the connection between the plug block and the adapter plug is made with cables.

According to a further embodiment of the invention, the connection of the plug block and the adapter plug between the plug block and the adapter plug has an elastically flexible region (for example an elastic circuit board) that allows an easy installation. According to an additional or alternative embodiment of the invention, the connection of the plug block and the adapter plug between said plug block and the adapter plug can be a rigid region that, for example, can advantageously be a circuit board on which an adapter plug can be mounted.

The surface coil connector device advantageously has a latch connection, in particular a manually detachable latch connection that enables a simple mounting.

The contacts for connection lines that can be connectable with the magnetic resonance tomography apparatus can be at least one coaxial contact and/or at least one signal contact, for example.

In an advantageous embodiment, in particular in the form of a safety clearance or a covering between the region of the plug module and other parts (for example safety-relevant parts, for instance electronics, transmitter units, receiver units etc.) in the safety coil, an exchange of the plug module can take place on site without having to send the surface coil to its manufacturer.

According to an embodiment of the invention, the surface coil has a cover that at least partially covers the plug module (as viewed from outside of the surface coil) and/or (additionally) fixes the plug module to the surface coil.

DESCRIPTION OF THE PREFERRED EMBODIMENTS

Figure 1:
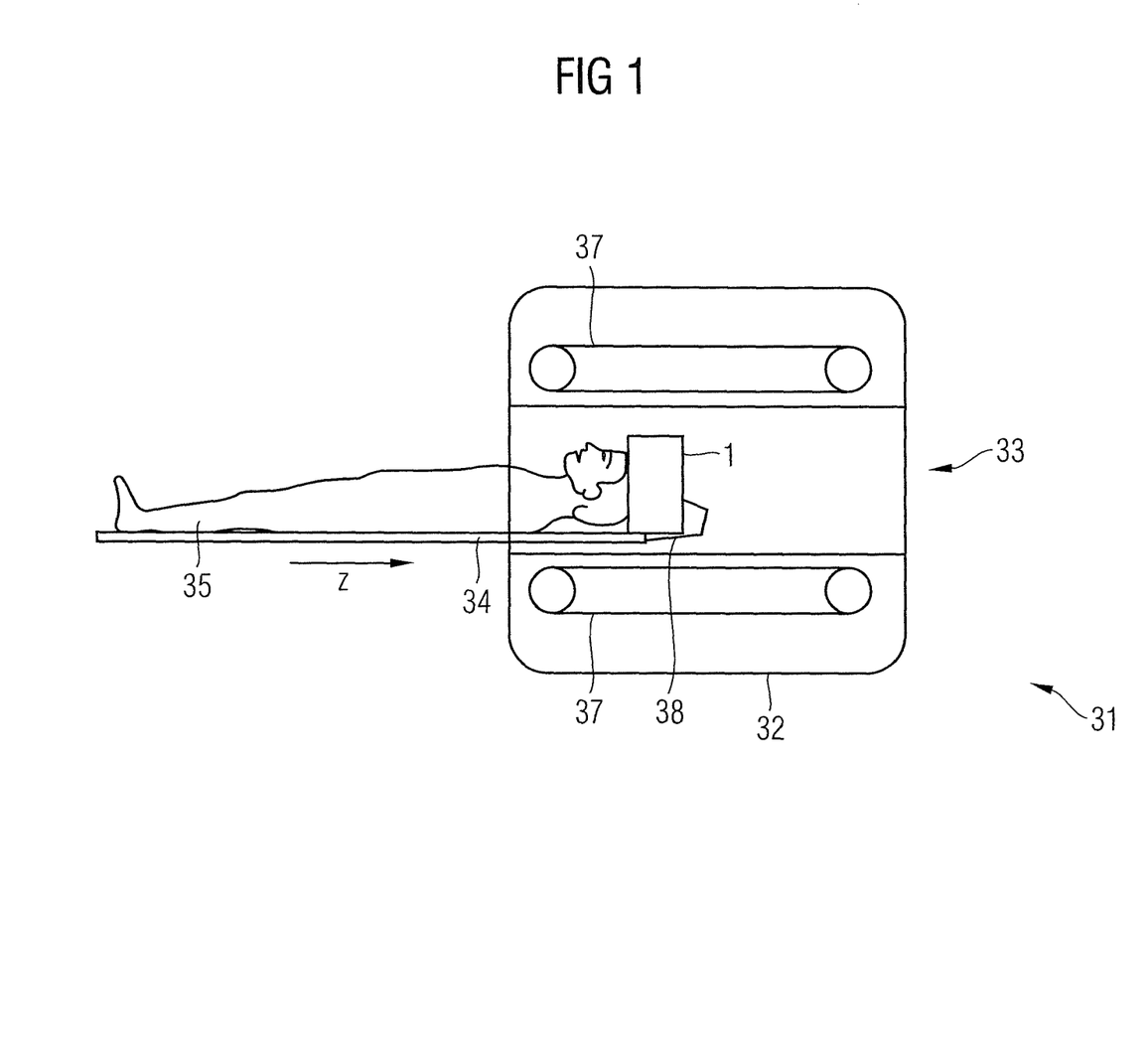
FIG. 1 schematically shows an MRT with coils as an overview presentation.

FIG. 1 shows a magnetic resonance apparatus MRT 31 with a whole-body coil 32 with a tube-shaped chamber 33 into which a patient bed 34 (for example with a patient 35 and a local coil 1) can be moved in order to generate exposures of the patient 35. Here a local coil 1 with which good exposures in a local region (here in the head area) are enabled is placed on the head of the patient. The local coil 1 is connected with connector cables 38, for example to terminals in the patient bed 34 or elsewhere on the MRT 31.

In the following a head coil with direct connector whose plug blocks can be exchanged with little effort by the customer is described as an exemplary embodiment of a local coil (also called a surface coil). Such an embodiment can be used not only in head coils but also in all other MRT surface coils.

Figure 2:
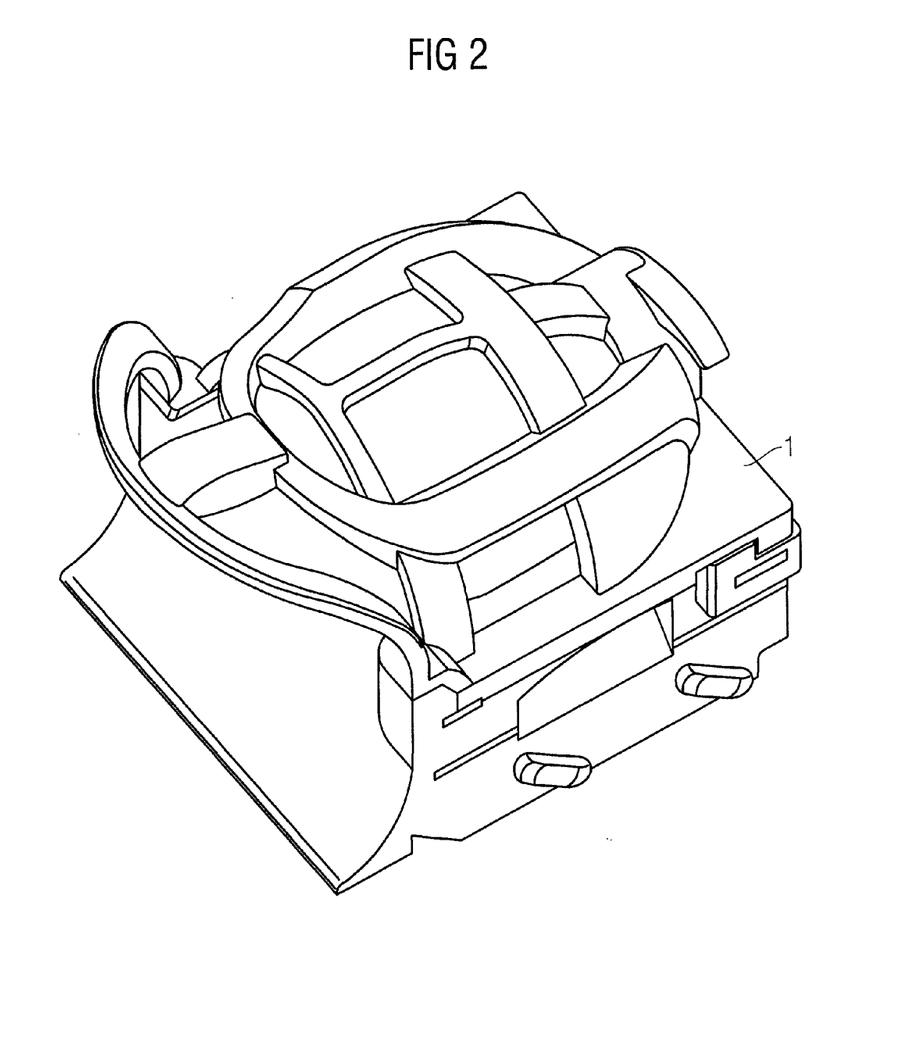
FIG. 2 shows a head coil in plan view.

FIG. 2 shows a head coil arrangement 1 that, in the following, is referred to as a head coil 1 for short (however, what is also meant by this is the housing etc. in addition to a coil). The head coil 1 can, for example, be placed on the head of a patient to be examined.

Figure 3:
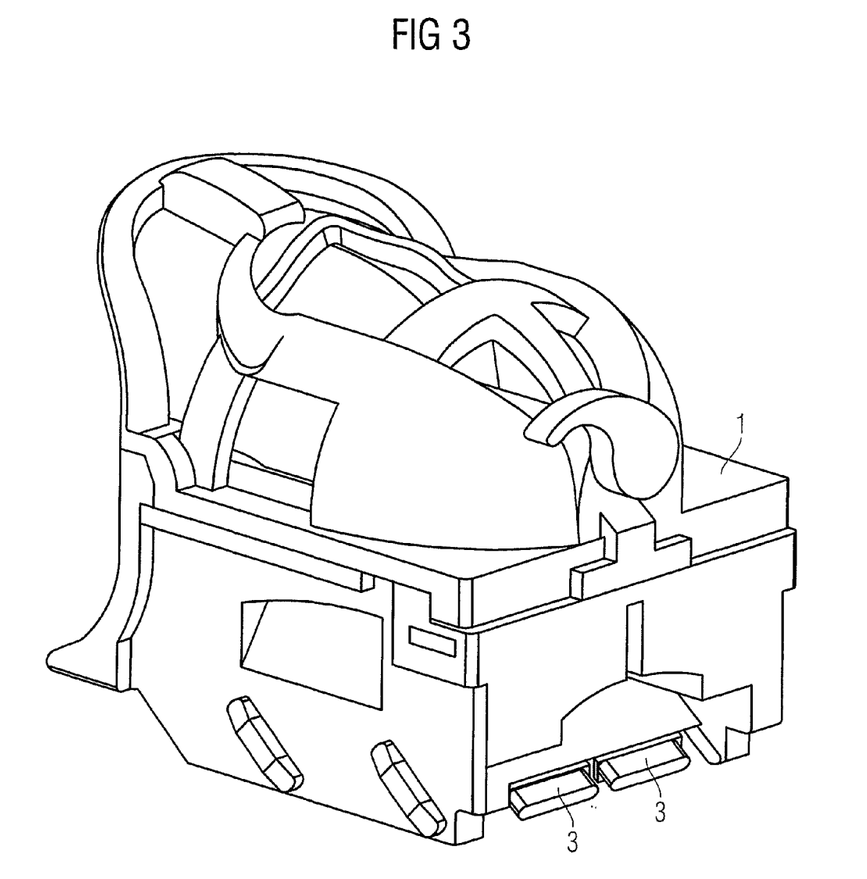
FIG. 3 shows the head coil in a side view.

FIG. 3 shows a side view of the head coil in which two plug blocks 3 (respectively designated with the reference character 3) of plug block modules are also visible, into which plug blocks cables 38 (coaxial cables, copper cables, signal lines etc.) can be inserted with which the head coil 1 can be connected to an MRT 31.

Figure 4:
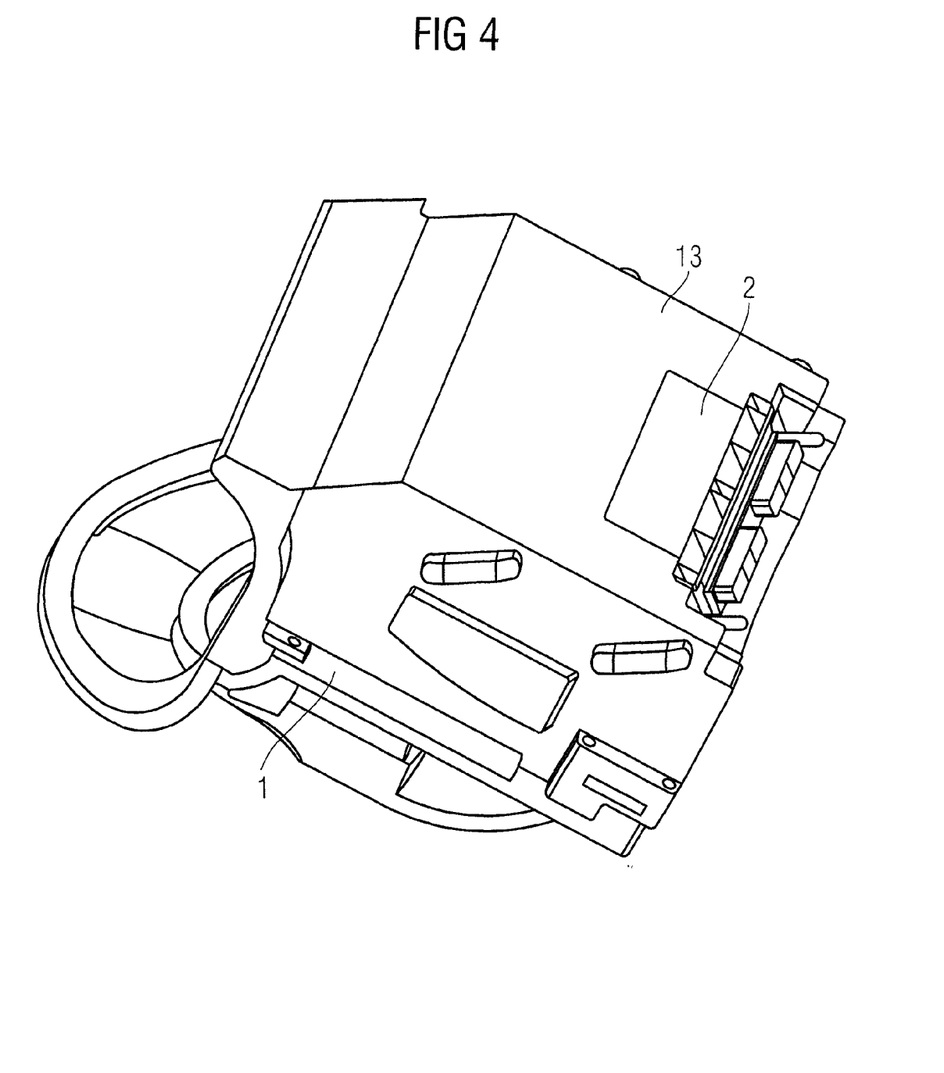
FIG. 4 shows the head coil in a view from below.

FIG. 4 shows the head coil 1 in a view from below. In this view a cover 2 located in the housing 13 of the head coil 1 is visible, with which cover 2 the plug blocks 3 are can also be partially covered and/or (additionally) fixed according to one possible embodiment.

Figure 5:
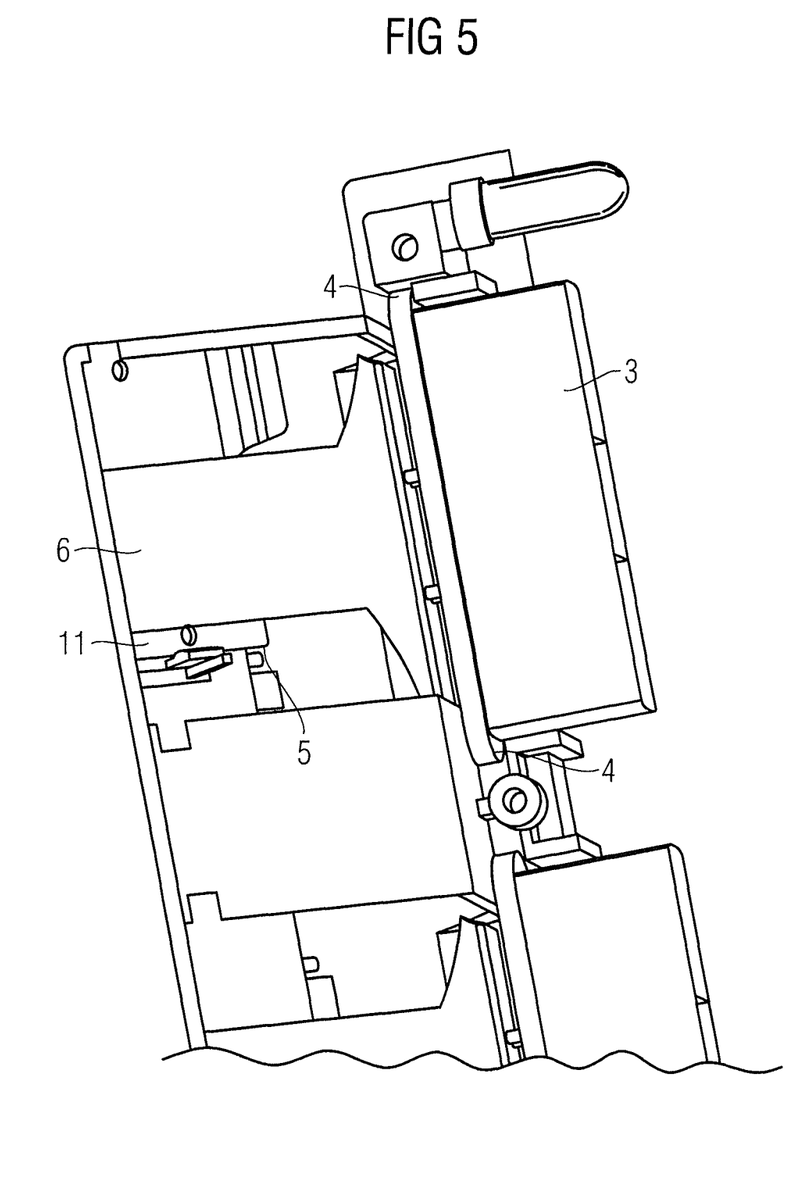
FIG. 5 shows two plug block modules that are attached to the head coil.

FIG. 5 shows in section two plug block modules 3 that can be connected to the head coil 1. (At least) One electronic element (10 in FIG. 6) of the head coil can be connected to an adapter plug interface 5 connected with the head coil. Plug blocks 3 here are inserted into guides 4 and can be fixed there (via insertion and/or also via clicking into place, for example) such that they can be released [detached].

Figure 6:
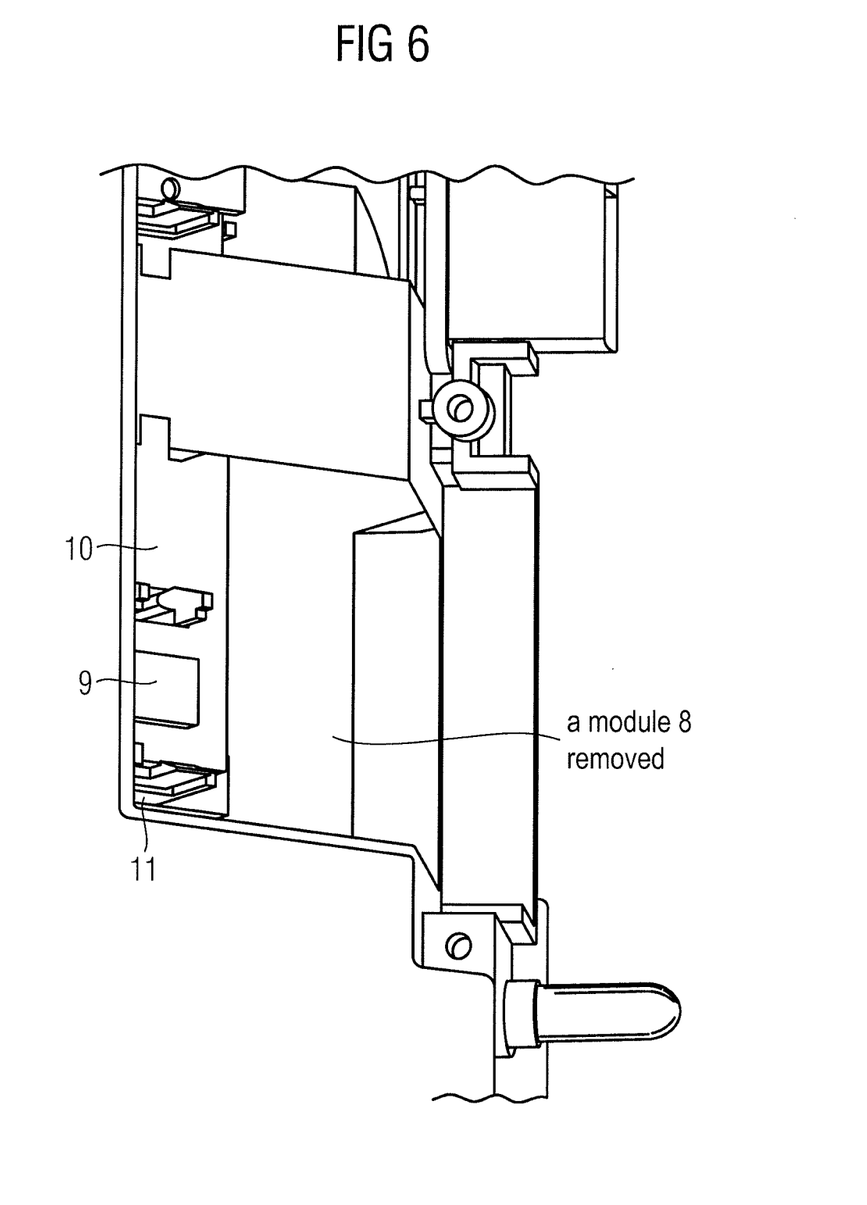
FIG. 6 shows a plug block module that is attached to the head coil.

In FIG. 6 only one plug block module 8 is attached to the head coil 1 while the additional plug block module (visible in FIG. 5) in FIG. 6 is not inserted into the housing 13 of the head coil 1, such that an electronic component 10 inside the coil 1 is visible, which electronic component 10 is connected (in an electrically conductive manner) with an adapter plug 9 at the head coil. Here a surface coil connector device 11 in the form of a latch connection 11 is provided to fix the plug block module 8 to the surface coil 1. The latch connection 11 here is designed so that it can be released manually (without tools) in the event of service.

Figure 7:
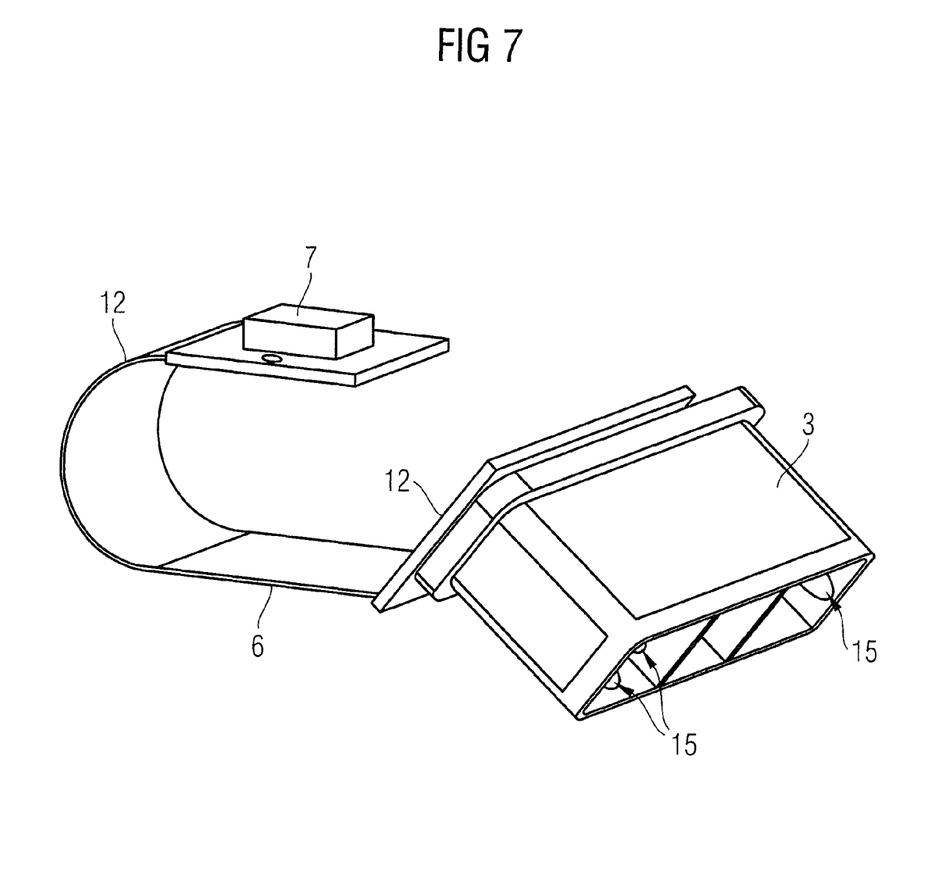
FIG. 7 shows a plug block module.

FIG. 7 shows an exchangeable plug block module 8 with a plug block 3 into which (or into whose contacts 15) cables 38 can be inserted with which the head coil 1 can be connected to an MRT 31.

The plug block 3 here is mounted on a circuit board 12. A connector 12, 6, 12 into which electrically conductive connectors are embedded here exists between the plug block 3 and an adapter plug 7; alternatively, the electrical connection can also be realized via cables. One part 6 of the connection here is flexibly pliable; other parts 12, 12 of the connection are fashioned to be rigid (here as circuit boards). This simplifies the mounting via insertion. An adapter plug 7 of the plug block module 8 can be inserted into an adapter plug 9 of the surface coil 1.

The service cover 2 (visible in FIG. 4) in the floor of the coil housing of the head coil 1 is attached to the coil housing 13, for example via bolting or locking. The size of the cover 2 is dimensioned so that safety-relevant regions inside the head coil are inaccessible from the outside (for example due to sufficient separation from the housing or from plug blocks, or via partitions walls). After opening the cover 2, plug blocks 3 can be slid from their guides 4 (visible in FIG. 5). In order to be able to exchange these without significant effort, the head coil 1 possesses another adapter plug interface 5 (visible in FIG. 5). The adapter plugs 7, 9 are held together with a locking connection 11 in order to prevent an unintended detachment due to vibrations present in the MR system and in order to be able to release the adapter plug without tools in the event of service.

For better handling, the connection 6 between the plug block 3 and the adapter plug connection (between 7 and 9) is of flexible design. This can ensue via flexible conductors or—as shown in the exemplary embodiment—via a flexible circuit board 6. The flexible coupling between the plug block 3 and the adapter plug 7 enables a simple handling for a service technician.

The invention enables a simple repair of the defective plug module 8 on site at the MRT. Product improvements to plug contacts can also be installed on site at the MRT by the customer. The compact structure of the module 8 (with rigid circuit boards and flexible connection 12) prevents damage during an exchange (in particular if no connector cables—which can be torn out or clamped—are present).

If an adapter plug 9 at the head coil is directly disentangled at an electronic component 10 inside the coil (circuit board—circuit board—connection), this saves on connection lines within the coil.

Although modifications and changes may be suggested by those skilled in the art, it is the intention of the inventors to embody within the patent warranted hereon all changes and modifications as reasonably and properly come within the scope of their contribution to the art.

We claim as our invention:

1. A plug module for a magnetic resonance surface coil comprising:
    a plug block body comprising contacts configured to releasably mate with and make an electrical connection to connection lines of a magnetic resonance tomography apparatus;
    a first adapter plug configured for reasonable insertion into a second adapter plug of a magnetic resonance surface coil, said first adapter plug being separate from said plug block body and spaced a distance from said plug block body;
    a surface coil connector device adapted to fix said plug block body to said surface coil;
    an electrical connection proceeding between said plug block body and said first adapter plug and spanning said distance to non-adjacently mechanically and electrically connect said first adapter plug and said plug body; and
    said plug block body, said first adapter plug, said surface coil connector device and said electrical connection forming an assembly of which said plug block body is a first free end and said first adapter body is a second free end.

2. A plug module as claimed in claim 1 wherein said electrical connection comprises cables.

3. A plug module as claimed in claim 1 wherein said connection proceeding between said plug block body and said first adapter plug comprises an elastically flexible region.

4. A plug module as claimed in claim 1 wherein said connection proceeding between said plug block body and said first adapter plug comprises a rigid region.

5. A plug module as claimed in claim 1 wherein said surface coil connector device comprises a latch connection.

6. A plug module as claimed in claim 1 wherein said surface coil connector device comprises a manually detachable latch connection.

7. A plug module as claimed in claim 1 wherein said contacts are selected from the group consisting of coaxial contacts and signal contacts.

8. A magnetic resonance surface coil assembly comprising:
    a magnetic resonance surface coil;
    a plug block body comprising contacts configured to releasably mate with and make an electrical connection to connection lines of a magnetic resonance tomography apparatus for said surface coil;
    a first adapter plug, said first adapter plug being separate from said plug block body and spaced a distance from said plug block body;
    an electrical connection proceeding between said plug block body and said first adapter plug and spanning said distance to non-adjacently mechanically and electrically connect said first adapter plug and said plug body;
    said surface coil comprising a second adapter plug in which said first said adapter plug is reasonably inserted;
    a surface coil connector device that fixes said plug block body to said surface coil; and said plug block body, said first adapter plug, said surface coil connector device and said electrical connection forming an assembly of which said plug block body is a first free end and said first adapter body is a second free end.

9. A surface coil assembly as claimed in claim 8 wherein said electrical connection comprises cables.

10. A surface coil assembly as claimed in claim 8 wherein said connection proceeding between said plug block body and said first adapter plug comprises an elastically flexible region.

11. A surface coil assembly as claimed in claim 8 wherein said connection proceeding between said plug block body and said first adapter plug comprises a rigid region.

12. A surface coil assembly as claimed in claim 8 wherein said surface coil connector device comprises a latch connection.

13. A surface coil assembly as claimed in claim 8 wherein said surface coil connector device comprises a manually detachable latch connection.

14. A surface coil assembly as claimed in claim 8 wherein said contacts are selected from the group consisting of coaxial contacts and signal contacts.

15. A surface coil assembly as claimed in claim 8 comprising a cover that forms said surface coil connector device.

16. A surface coil assembly as claimed in claim 15 wherein said cover fixes said plug module relative to said surface coil with a safety clearance between said plug module and said surface coil.

* * * * *